United States Patent
Yamada

[11] Patent Number: 5,105,100
[45] Date of Patent: Apr. 14, 1992

[54] EASILY AND QUICKLY TESTABLE MASTER-SLAVE FLIPFLOP CIRCUIT

[75] Inventor: Kazuyoshi Yamada, Tokyo, Japan

[73] Assignee: NEC Corporation, Tokyo, Japan

[21] Appl. No.: 724,037

[22] Filed: Jul. 1, 1991

[30] Foreign Application Priority Data

Jun. 29, 1990 [JP] Japan .................. 2-171473

[51] Int. Cl.$^5$ .............. H03K 3/289; H04B 17/00
[52] U.S. Cl. ..................... 307/272.2; 307/272.1; 307/279; 324/158 R; 371/22.3
[58] Field of Search ............... 307/272.1, 272.2, 279, 307/443, 572; 324/158 R; 371/22.3

[56] References Cited

U.S. PATENT DOCUMENTS

| | | | |
|---|---|---|---|
| 4,495,629 | 1/1985 | Zasio et al. | 307/272.2 |
| 4,669,061 | 5/1987 | Bhavsa | 371/22.3 |
| 4,782,283 | 11/1988 | Zasio | 371/22.3 |
| 4,843,254 | 6/1989 | Motegi et al. | 307/279 |

FOREIGN PATENT DOCUMENTS

| | | | |
|---|---|---|---|
| 3443788 | 6/1986 | Fed. Rep. of Germany | 307/272.2 |
| 0079328 | 5/1983 | Japan | 307/272.2 |
| 0016710 | 1/1988 | Japan | 307/272.2 |
| 0117205 | 5/1990 | Japan | 307/272.2 |
| 0203611 | 8/1990 | Japan | 307/272.2 |

Primary Examiner—Stanley D. Miller
Assistant Examiner—Terry D. Cunningham
Attorney, Agent, or Firm—Sughrue, Mion, Zinn, Macpeak & Seas

[57] ABSTRACT

A master/slave flipflop comprises a master flipflop including a first inverter having an input for receiving an input signal, and a second inverter having an input connected to an output of the first inverter, and a first switch means connected between an output of the second inverter and the input of the first inventer. A slave flipflop of the master/slave flipflop includes a third inverter having an input for receiving an output signal of the master flipflop, and a fourth inverter having an input connected to an output of the third inverter, and a second switch means connected between an output of the fourth inverter and the input of the third inverter. A third switch is connected between the output of the second inverter and the input of the third inverter, and a fourth switch is connected between the output of the first inverter and the input of the third inverter. A controller controls the first to fourth switches so as to bring the first to third switches into off condition and also to bring the fourth switch into an on condition so that all the first to fourth inverters are cascaded.

5 Claims, 5 Drawing Sheets

TS="L"

TS="H"

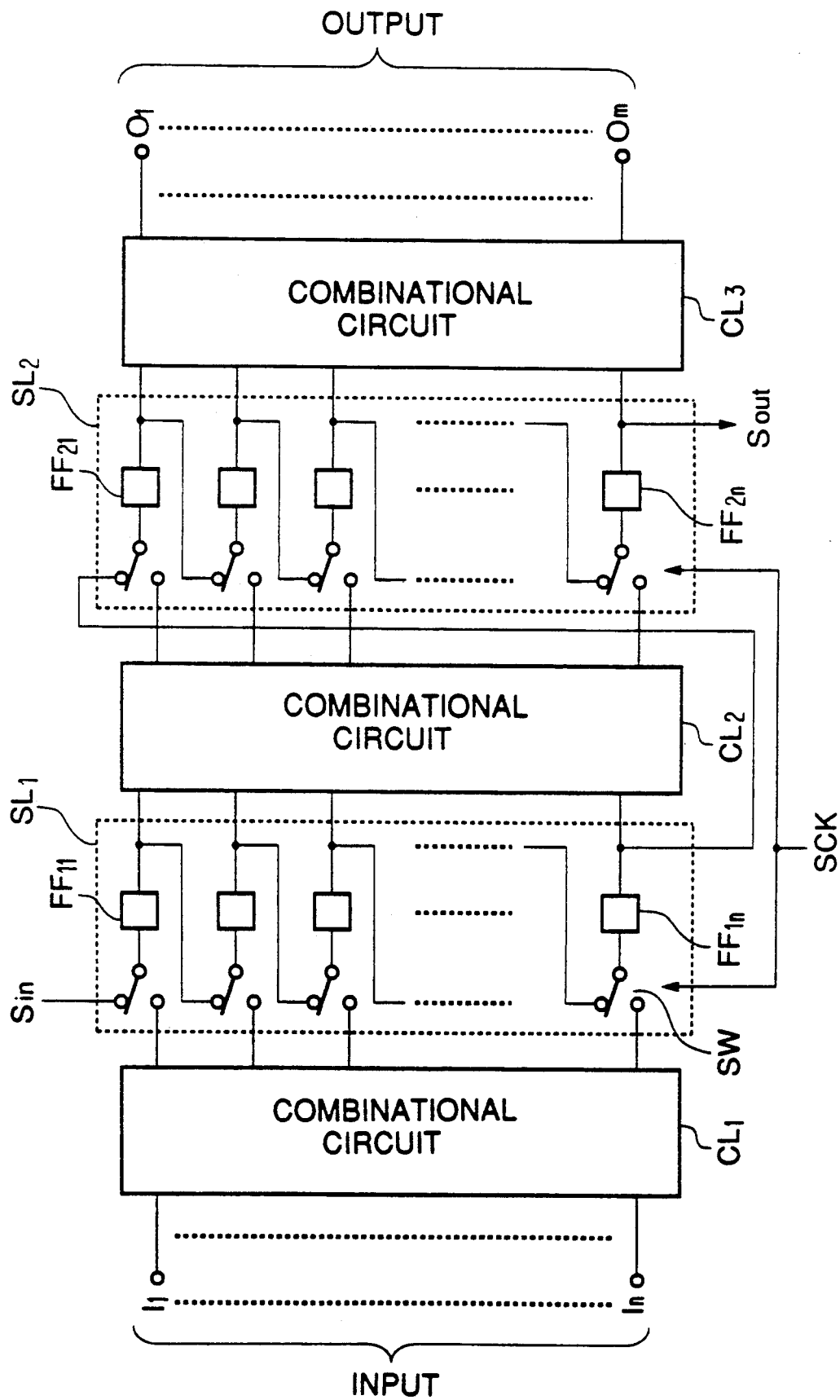

EASILY AND QUICKLY TESTABLE MASTER-SLAVE FLIPFLOP CIRCUIT

BACKGROUND OF THE INVENTION

1. Field of the invention

The present invention relates to a master/slave flipflop, and more specifically to a testable master/slave flipflop which can be used in a large scaled integrated circuit.

2. Description of related art

Conventionally, master/slave flipflops have been frequently used in logic networks. A typical one of the master/slave flipflops includes a master flipflop and a slave flipflop. The master flipflop is composed of a first inverter having an input connected to receive an input signal through a first transfer gate, a second inverter having an input connected to an output of the first inverter, and a second transfer gate connected between an output of the second inverter and the input of the first inverter. The slave flipflop is composed of a third inverter having an input connected through a third transfer gate to the output of the master flipflop, a fourth inverter having an input connected to an output of the third inverter, and a fourth transfer gate connected between an output of the fourth inverter and the input of the third inverter. The first to fourth transfer gates are controlled to be opened or closed by a clock signal and an inverted signal of the clock signal as follows:

When the clock signal is at a high level "H", the first and fourth transfer gates are opened or turned on, and the second and third transfer gates are closed or turned off, so that the master flipflop is brought into a data read condition and the slave flipflop is brought into a hold condition. Thereafter, if the clock is brought to a low level "L", the first and fourth transfer gates are closed or turned off, and the second and third transfer gates are opened or turned on, so that the master flipflop is brought into the hold condition and the slave flipflop is brought into the data read condition. Thus, at least two state transitions of the clocks ("H"→"L" and "L"→"H") are required to determine internal conditions of the master/slave flipflop. In other words, the master/slave circuit is a sequential circuit.

If a logic network having a plurality of input terminals $I_1$ to $I_n$ and a plurality of output terminals $O_1$ to $O_n$ is formed by using a number of master/slave flipflops which are the same as the above mentioned master/slave flipflops, the formed logic network can be divided into a plurality of combinational circuits and a plurality of sequential circuits, each one of the sequential circuits including a group of master/slave flipflops and being connected between each pair of combinational circuits.

When the above mentioned logic network is assembled in a large scaled integrated circuit, it is impossible to externally directly detect or modify a logic condition of a line or a switch in the inside of the logic network after manufactured. Under this condition, for this test, it has been conventionally performed to apply appropriate input signals to all the input terminals $I_1$ to $I_n$ and to investigate output conditions appearing on all the output terminals $O_1$ to $O_n$, so as to discriminate an acceptable/faulty product on the basis of whether or not the output conditions of all the output terminals $O_1$ to $O_n$ coincide with desired values, respectively.

However, this test method generally requires a long test time, and is difficult to discriminate an acceptable/faulty product concerning the master/slave flipflops. Therefore, in order to test all the groups of master/slave flipflops, it has been widely used to connect all the master/slave flipflops in series at the time of testing, and to supply an input signal to a first stage flipflop of the series-connected flipflops and at the same time to supply test-only clock signals to all the series-connected flipflops, so that the input signal is transferred through the series-connected flipflops, one stage by one stage, in response to a train of clock signals, and an output signal is obtained from a final stage flipflop of the series-connected flipflops. This method is called a "scan path" method, and is known as a test method suitable to a large scaled integrated circuit.

However, as mentioned hereinbefore, since the master/slave circuit is a sequential circuit, even if the scan path method is used for test of the logic network incorporating therein a number of master/slave flipflops, it is necessary to supply the testing clocks of the number which is a double of the number of all the master/slave flipflops included in the logic network. Therefore, a long test time has still been required.

In addition, in the case that the scan path method is applied in the network having the conventional master/slave flipflops, a large group of switches and a large group of wirings have been required for realizing the series connection of all the master/slave flipflops for the testing. This results in increase of the circuit size by about 20% to 30% in comparison with the case in which neither switch nor wiring used only for the testing is provided.

SUMMARY OF THE INVENTION

Accordingly, it is an object of the present invention to provide a master/slave flipflop which has overcome the above mentioned defect of the conventional one.

Another object of the present invention is to provide a master/slave flipflop capable of allowing flipflops to be tested in a short time without greatly increasing the circuit size.

The above and other objects of the present invention are achieved in accordance with the present invention by a master/slave flipflop comprising: a master flipflop including a first logic gate having an input for receiving an input signal, and a second logic gate having an input connected to an output of the first logic gate, and a first switch means connected between an output of the second logic gate and the input of the first logic gate; a slave flipflop including a third logic gate having an input for receiving an output signal of the master flipflop, and a fourth logic gate having an input connected to an output of the third logic gate, and a second switch means connected between an output of the fourth logic gate and the input of the third logic gate; a third switch means connected between the output of the second logic gate and the input of the third logic gate; a fourth switch means connected between the output of the first logic gate and the input of the third logic gate; and control means for controlling the first to fourth switch means so as to bring the first to third switch means into an off condition and also to bring the fourth switch means into an on condition so that all the first to fourth logic gates are cascaded.

The above and other objects, features and advantages of the present invention will be apparent from the following description of preferred embodiments of the invention with reference to the accompanying drawings.

BRIEF DESCRIPTION OF THE DRAWINGS

FIG. 6 is a block diagram of the network shown in FIG. 5, in the case of testing all the master/slave flipflops in the "scan path" method.

DESCRIPTION OF THE PREFERRED EMBODIMENTS

Figure 1:
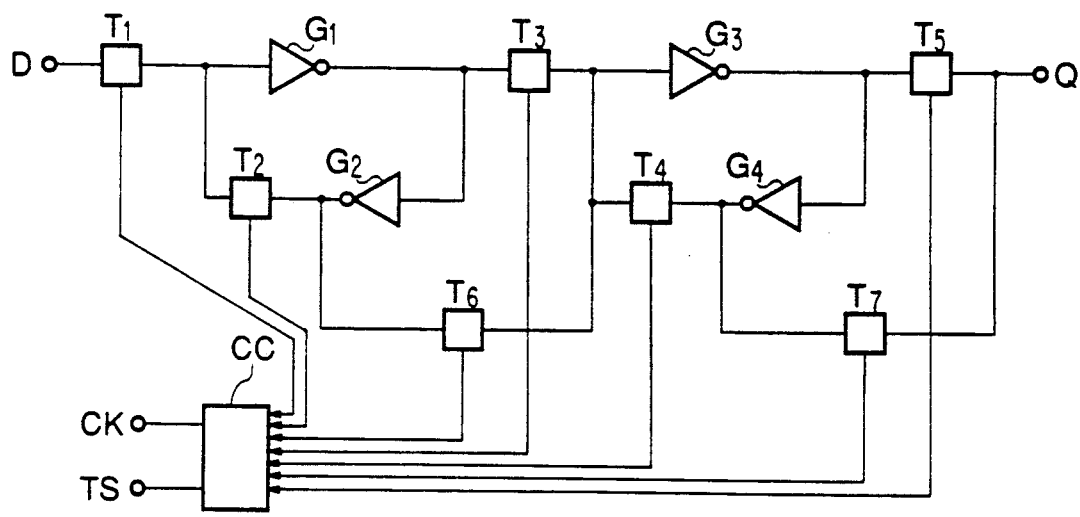
FIG. 1 is a conceptional logic block diagram of a first embodiment of the master/slave flipflop in accordance with the present invention.

Referring to FIG. 1, there is shown a conceptional logic block diagram of a first embodiment of the master/slave flipflop in accordance with the present invention.

The shown master/slave flipflop includes a master flipflop and a slave flipflop. The master flipflop is composed of an inverter $G_1$ having an input connected to an input data signal terminal D through a transfer gate $T_1$, another inverter $G_2$ having an input connected to an output of the inverter $G_1$, and another transfer gate $T_2$ connected between an output of the inverter $G_2$ and the input of the inverter $G_1$. The slave flipflop is composed of an inverter $G_3$ having an input connected through a transfer gate $T_3$ to the output of the master flipflop, namely, the output of the inverter $G_1$, another inverter $G_4$ having an input connected to an output of the third inverter $G_3$, and another transfer gate $T_4$ connected between an output of the inverter $G_4$ and the input of the inverter $G_3$.

The above mentioned arrangement is similar to that of the conventional master/slave flipflop. In addition, in accordance with the present invention, a transfer gate $T_5$ is connected between the output of the inverter $G_3$ and an data output terminal Q of the master/slave flipflop. The output of the inverter $G_2$ is connected through a transfer gate $T_6$ to the input of the slave flipflop, namely the input of the inverter $G_3$. In addition, the output of the inverter $G_4$ is connected through a transfer gate $T_7$ to the data output terminal Q of the master/slave flipflop.

The transfer gates $T_1$ to $T_7$ are controlled to be opened or closed by a controller CC which receives a clock signal CK and a test control signal TS. When the test control signal TS indicates that the shown flipflop operates as an ordinary master/slave flipflop, the controller CC controls to maintain the transfer gate $T_5$ in an on condition and the transfer gates $T_6$ and $T_7$ in an off condition. In addition, when the clock signal CK is at a high level "H", the transfer gates $T_1$ and $T_4$ are opened or turned on, and the second and third transfer gates $T_2$ and $T_3$ are closed or turned off, so that the master flipflop is brought into a data read condition and the slave flipflop is brought into a hold condition. Thereafter, if the clock is brought to a low level "L", the first and fourth transfer gates $T_1$ and $T_4$ are closed or turned off, and the second and third transfer gates $T_2$ and $T_3$ are opened or turned on, so that the master flipflop is brought into the hold condition and the slave flipflop is brought into the data read condition.

On the other hand, when the test control signal TS indicates a test mode, the controller CC controls to maintain the transfer gate $T_5$ in an off condition and the transfer gates $T_6$ and $T_7$ in an on condition. In addition, the controller CC controls to maintain the transfer gate $T_1$ in an on condition and the transfer gates $T_2$ to $T_4$ in an off condition, regardless of the state of the clock signal CK.

Figure 2:
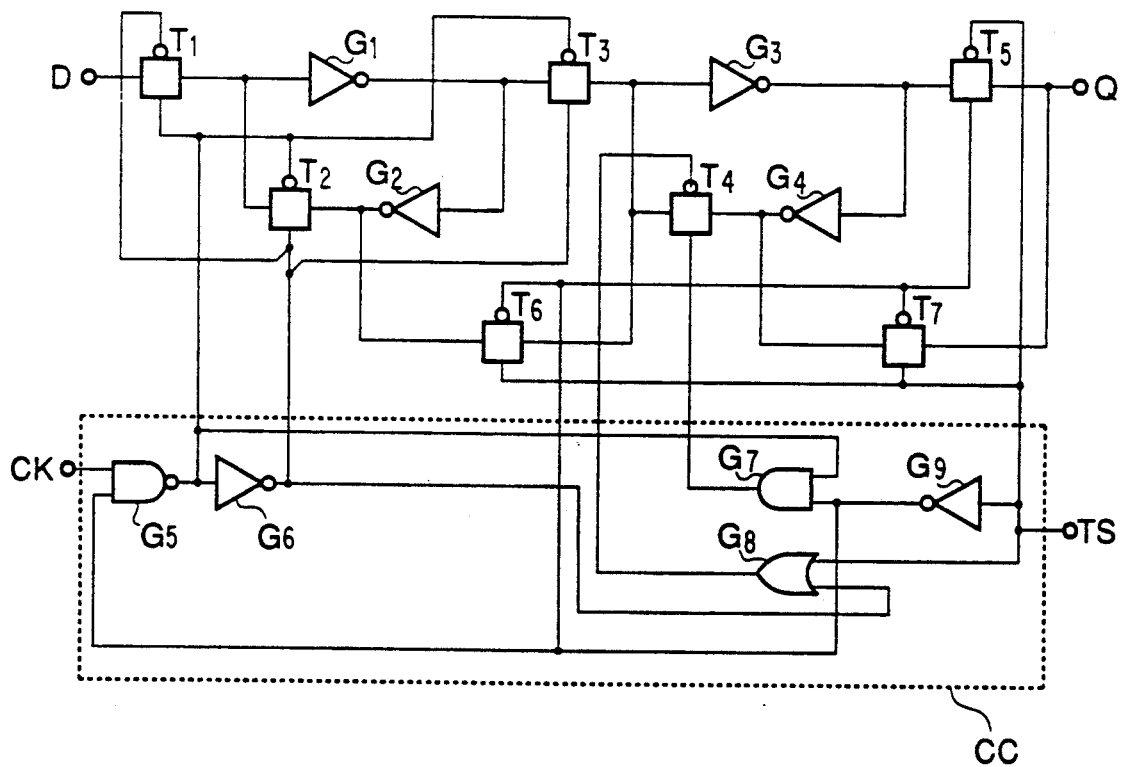
FIG. 2 is a detailed logic block diagram of the first embodiment of the master/slave flipflop shown in FIG. 1.

Turning to FIG. 2, there is shown a detailed logic block diagram of the first embodiment of the master/slave flipflop shown in FIG. 1. In FIG. 2, elements similar to those shown in FIG. 1 are given the same Reference Signs, and explanation thereof will be omitted.

As seen from FIG. 2, each of the transfer gates is of the type receiving a non-inverted control signal and an inverted control signal. As well known, this type of transfer gate can be formed of an n-channel MOS transistor and a p-channel MOS transistor connected to each other in parallel, and therefore, a detailed explanation will be omitted.

In addition, the control circuit includes a NAND gate $G_5$ having a first input connected to receive the clock signal CK, and an output connected to a non-inverted control input of the transfer gate $T_1$ and an inverted control input of each of the transfer gates $T_2$ and $T_3$. The output of the NAND gate $G_5$ is also connected to an input of an inverter $G_6$ and a first input of an AND gate $G_7$, respectively. An output of the inverter $G_6$ is connected to an inverted control input of the transfer gate $T_1$ and a non-inverted control input of each of the transfer gates $T_2$ and $T_3$. The output of the inverter $G_6$ is also connected to a first input of an OR gate $G_8$.

On the other hand, the test control signal TS is supplied to an inverted control input of the transfer gate $T_5$ and a non-inverted control input of each of the transfer gates $T_6$ and $T_7$, and also to an input of an inverter $G_9$. An output of the inverter $G_9$ is connected to a non-inverted control input of the transfer gate $T_5$ and an inverted control input of each of the transfer gates $T_6$ and $T_7$. The output of the inverter $G_9$ is also connected to a second input of the NAND gate $G_5$, and a second input of the AND gate $G_7$. The AND gate $G_7$ has an output connected to a non-inverted control input of the transfer gate $T_4$. The test control signal TS is also supplied to a second input of the OR gate $G_8$, which in turn has an output connected to an inverted control input of the transfer gate $T_4$.

Now, an operation of the circuit shown in FIG. 2 will be described.

When the test control signal TS is inactive, for example, at a low level ("L"), the transfer gate $T_5$, controlled by the test control signal TS and an inverted signal thereof, is brought into an on condition, and the transfer gates $T_6$ and $T_7$ are brought into an off condition, respectively. On the other hand, since the NAND gate $G_5$ receives at its second input the inverted signal of the test control signal TS, which is at a high level in this situation, the NAND gate $G_5$ is maintained in an opened condition. Therefore, the NAND gate $G_5$ outputs an inverted signal of the clock signal CK. In this condition, the transfer gates $T_1$, $T_2$ and $T_3$ are controlled to operate in an ordinary mode in accordance with the clock CK. Furthermore, the first input of the AND gate $G_7$ and the first input of the OR gate $G_8$ are supplied with the high level signal from the inverter $G_9$ and the low level test control signal TS, respectively, the these gates are maintained in an opened condition. The transfer gate $T_4$ is on-off controlled by the output signals of the NAND gates $G_5$ and the inverter $G_6$, similarly to the transfer gates $T_1$, $T_2$ and $T_3$.

Figure 3A:
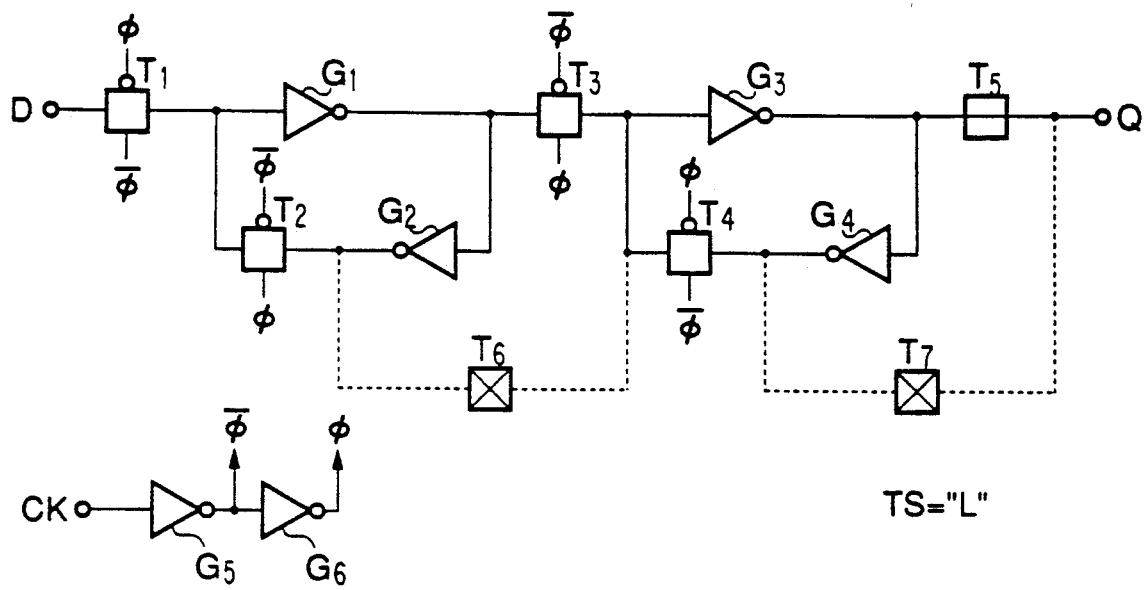
FIGS. 3A and 3B are two different circuit condition diagrams of the master/slave flipflop shown in the FIG. 2 for illustrating the operation of the master/slave flipflop shown in the FIG. 2.

A equivalent circuit of this condition of the shown master/slave flipflop becomes as shown in FIG. 3A. It will be apparent from FIG. 3A that the shown master/slave flipflop operates similarly to the conventional master/slave flipflop.

When the test control signal TS is active, for example, at a high level ("H"), the NAND gate $G_5$, the AND gate $G_7$ and the OR gate $G_8$ are put in an closed condition, in such a manner that the respective outputs of the NAND gate $G_5$ and the OR gate $G_8$ are fixed to the high level "H", and the respective outputs of the inverter $G_6$ and the AND gate $G_7$ are fixed to the high level "L". In this condition, accordingly, the transfer gates $T_1$, $T_6$ and $T_7$ is brought into an on condition, and the transfer gates $T_2$ to $T_5$ is brought into an off condition.

Figure 3B:
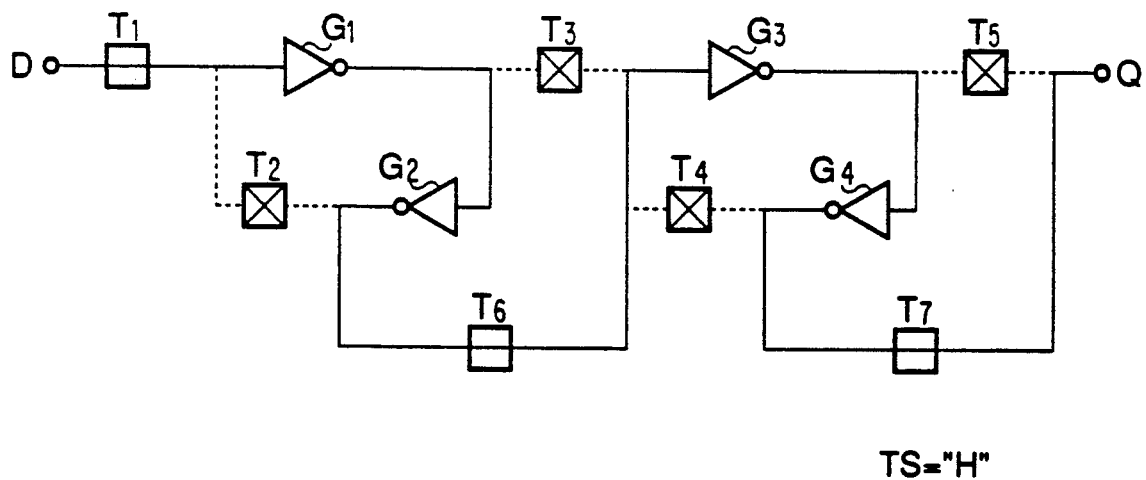

A equivalent circuit of this condition of the shown master/slave flipflop becomes as shown in FIG. 3B. As will be apparent from FIG. 3B, all of the inverters that form one master/slave flipflop are serially connected or cascaded so that the input signal applied to the input terminal D is transferred through the inverters $T_1$, $T_2$, $T_3$ and $T_4$ in the named order to the output terminal Q, without being supplied with the clock signal. In this condition, the shown circuit no longer is the sequential circuit, but rather, is a perfect combinational circuit.

Figure 5:
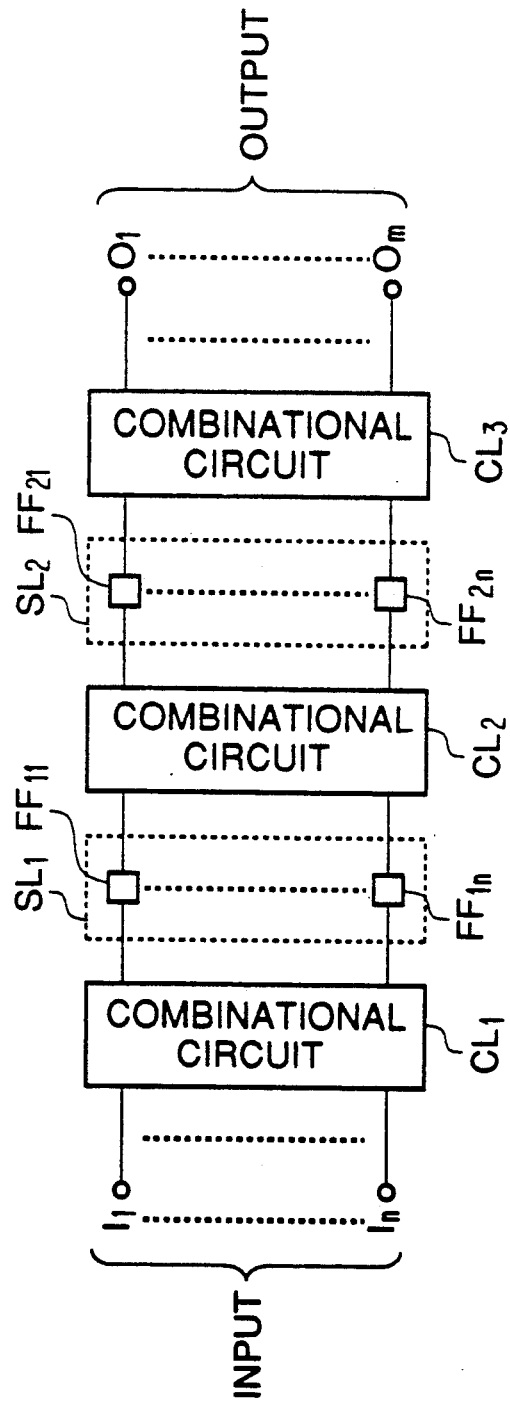
FIG. 5 is a block diagram of a logic network formed by using a number of master/slave flipflops.

Therefore, a logic network having a plurality of input terminals $I_1$ to $I_n$ and a plurality of output terminals $O_1$ to $O_n$, can be formed by using a number of master/slave flipflops which are the same as the above mentioned master/slave flipflop in accordance with the present invention, as shown in FIG. 5. The formed logic network can be divided into a plurality of combinational circuits $CL_1$, $CL_2$ and $CL_3$ and a plurality of sequential circuits $SL_1$ and $SL_2$, each one of the sequential circuits $SL_1$ and $SL_2$ including a group of master/slave flipflops $FF_{1i}$ or $FF_{2i}$ (i=1 to n) and being connected between each pair of adjacent combinational circuits $CL_1$ and $CL_2$ or $CL_2$ and $CL_3$.

Referring to FIG. 6, there is shown a connection diagram of the master/slave flipflops included in the logic network shown in FIG. 5. At the time of testing, all the master/slave flipflops included in the logic network are serially connected as shown by associated switches SW which are controlled by a control signal SCK to assume a position as shown in FIG. 6. In the circuit shown in FIG. 6, if all of the master/slave flipflops included in the sequential circuits $SL_1$ and $SL_2$ are constructed in accordance with the above mentioned embodiment, all of the master/slave flipflops included in the sequential circuits $SL_1$ and $SL_2$ form one complete combinational circuit. In other words, the sequential circuits $SL_1$ and $SL_2$ can be regarded as forming one combinational circuit. Therefore, if an input signal is applied to an input Sin of the combinational circuit formed of the sequential circuits $SL_1$ and $SL_2$, namely an input of a first stage master/slave flipflop $FF_{11}$ included in the sequential circuit $SL_1$, an output signal is generated, without applying a clock signal, from an output Sout of the combinational circuit formed of the sequential circuits $SL_1$ and $SL_2$, namely an output of a final stage master/slave flipflop $FF_{2n}$ included in the sequential circuit $SL_2$.

Figure 4:
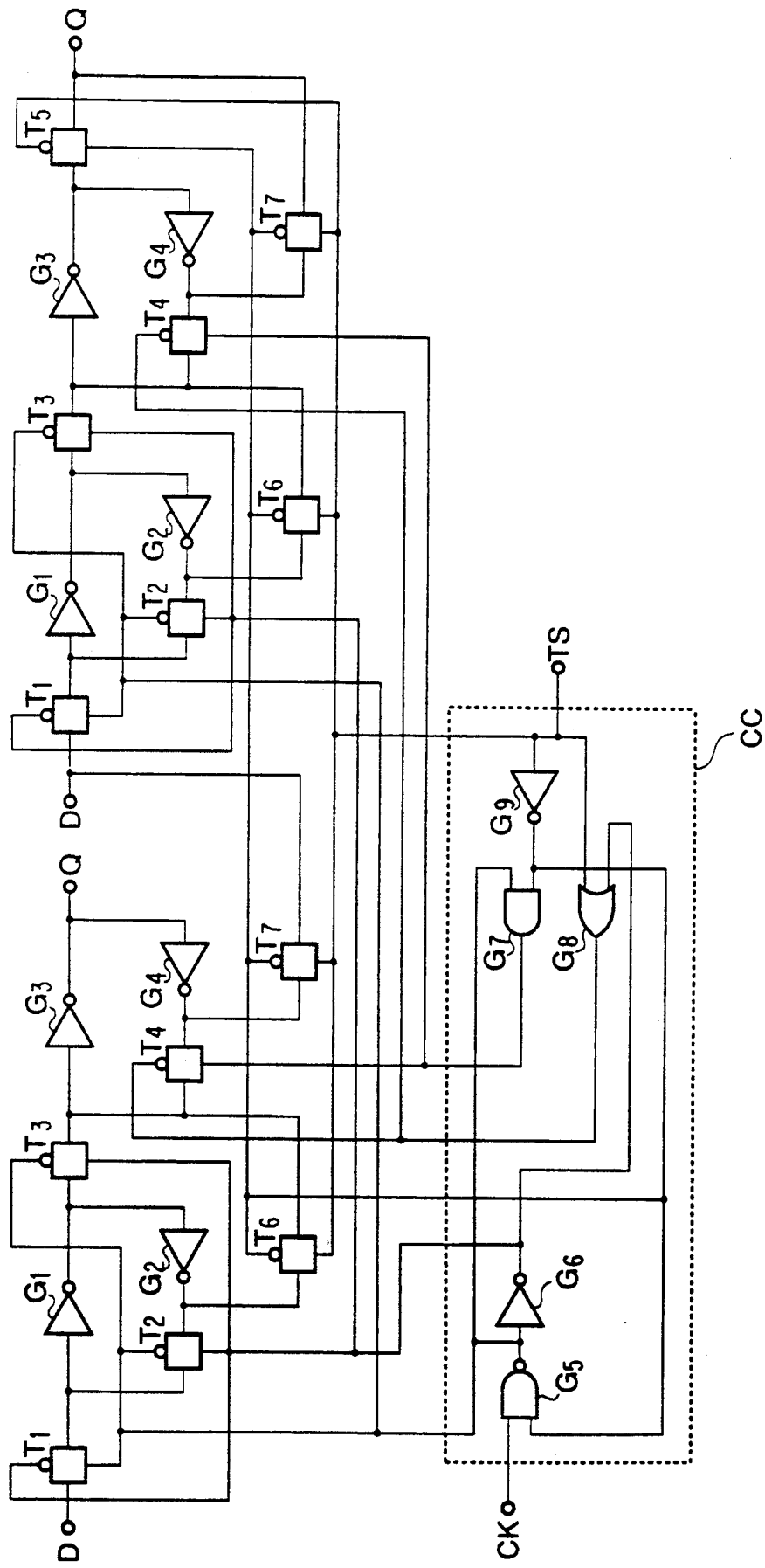
FIG. 4 is a detailed logic block diagram of a second embodiment of the master/slave flipflop in accordance with the present invention.

Turning to FIG. 4, there is shown a cascade connection of two master/slave flipflops which are the same as the first embodiment shown in FIG. 2. Therefore, elements corresponding to those shown in FIG. 2 will be given the same reference signs, and explanation thereof will be omitted. As seen from FIG. 4, a right side master/slave flipflop is completely the same as that shown in FIG. 2, but the transfer gate $T_5$ is omitted from the left side master/slave flipflop. Accordingly, if the transfer gate $T_5$ is omitted from each of master/slave flipflops excluding a final stage master/slave flipflop, the circuitry can be simplified.

In the above mentioned embodiments, the logic gates included in the master/slave flipflop have been formed of an inverter or NOT gate, but can be formed of other logic gates, for example, NAND gates or NOR gates, which have a NOT function.

The invention has thus been shown and described with reference to the specific embodiments. However, it should be noted that the present invention is in no way limited to the details of the illustrated structures but changes and modifications may be made within the scope of the appended claims.

I claim:

1. A master/slave flipflop comprising:
a master flipflop including a first logic gate having an input for receiving an input signal, and a second logic gate having an input connected to an output of said first logic gate, and a first switch means connected between an output of said second logic gate and said input of said first logic gate;
a slave flipflop including a third logic gate having an input for receiving an output signal of said master flipflop, and a fourth logic gate having an input connected to an output of said third logic gate, and a second switch means connected between an output of said fourth logic gate and said input of said third logic gate, said output of said third logic gate being coupled to an output node of said master/slave flipflop;
a third switch means connected between said output of said first logic gate and said input of said third logic gate;
a fourth switch means connected between said output of said second logic gate and said input of said third logic gate; and
control means for controlling said first to fourth switch means operates in a normal operating mode to provide clocking to the master/slave flipflop and in a test mode to bring said first to third switch means into an off condition and also to bring said fourth switch means into an on condition so that all said first to fourth logic gates are cascaded.

2. A master/slave flipflop claimed in claim 1 wherein each of said first to fourth logic gates has a NOT function.

3. A master/slave flipflop claimed in claim 2 wherein each of said first to fourth logic gates is an inverter.

4. A master/slave flipflop claimed in claim 1 further including a fifth switch means connected between said output of said fourth logic gate and said output node of said master/slave flipflop and a sixth switch means connected between said output of said third logic gate and said output node of said master/slave flipflop and wherein said control means controls said first to sixth switch means so as to bring said first to third and sixth switch means into an off condition and to bring said fourth and fifth switch means into an on condition so that all said first to fourth logic gates are cascaded.

5. A master/slave flipflop claimed in claim 4 wherein said control means receives a test signal and a clock signal and operates in such a manner that when said test signal is active at a first predetermined level indicating said test node, said control means brings said first to third and sixth switch means into an off condition and also brings said fourth and fifth switch means into an on condition, regardless of the state of said clock signal, and when said test signal is at a second predetermined level indicating said normal operating mode, said control means brings said fourth and fifth switch means into an off condition, regardless of the state of said clock signal.

* * * * *

UNITED STATES PATENT AND TRADEMARK OFFICE
CERTIFICATE OF CORRECTION

PATENT NO. : 5,105,100

DATED : April 14, 2992

INVENTOR(S) : Kazuyoshi Yamada

It is certified that error appears in the above-identified patent and that said Letters Patent is hereby corrected as shown below:

Abstract, line6, delete "inventor" and insert --inverter--:

Col. 7, line 7, delete "active".

Signed and Sealed this

Twenty-second Day of June, 1993

Attest:

MICHAEL K. KIRK

*Attesting Officer*   Acting Commissioner of Patents and Trademarks